(12) United States Patent
Jiang

(10) Patent No.: US 10,283,378 B2
(45) Date of Patent: May 7, 2019

(54) FLUXING UNDERFILL COMPOSITIONS

(71) Applicant: Henkel IP & Holding GmbH, Duesseldorf (DE)

(72) Inventor: Hong Jiang, Irvine, CA (US)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

(21) Appl. No.: 15/899,878

(22) Filed: Feb. 20, 2018

(65) Prior Publication Data

US 2018/0350631 A1 Dec. 6, 2018

Related U.S. Application Data

(63) Continuation of application No. PCT/US2016/047004, filed on Aug. 15, 2016.
(Continued)

(51) Int. Cl.

| | |
|---|---|
| H01L 23/28 | (2006.01) |
| H01L 21/56 | (2006.01) |
| C08G 59/02 | (2006.01) |
| C08G 59/18 | (2006.01) |
| C09D 163/00 | (2006.01) |
| C08L 63/00 | (2006.01) |
| H01L 23/29 | (2006.01) |
| H01L 21/48 | (2006.01) |
| C08G 59/50 | (2006.01) |
| C08K 5/09 | (2006.01) |

(Continued)

(52) U.S. Cl.
CPC ............ *H01L 21/563* (2013.01); *C08G 59/02* (2013.01); *C08G 59/18* (2013.01); *C08G 59/5033* (2013.01); *C08K 3/013* (2018.01);
*C08K 5/09* (2013.01); *C08L 63/00* (2013.01); *C09D 163/00* (2013.01); *H01L 21/48* (2013.01); *H01L 23/293* (2013.01); *C08G 59/20* (2013.01); *C08G 59/24* (2013.01); *C08G 59/4014* (2013.01); *C08G 59/42* (2013.01); *C08G 59/50* (2013.01); *C08L 2203/16* (2013.01); *C08L 2203/20* (2013.01)

(58) Field of Classification Search
CPC ...... C09J 163/00; C08L 63/00; H05K 31/305; H05K 2/284
USPC ............... 257/782, 787, 788, 789, 793, 795; 438/113, 118, 127
See application file for complete search history.

(56) References Cited

U.S. PATENT DOCUMENTS

| | | |
|---|---|---|
| 4,477,629 A | 10/1984 | Hefner |
| 4,528,366 A | 7/1985 | Woo et al. |

(Continued)

FOREIGN PATENT DOCUMENTS

| | | |
|---|---|---|
| GB | 1305702 | 5/2013 |
| JP | 4112306 | 7/2008 |

(Continued)

OTHER PUBLICATIONS

International Search Report issued in connection with International Patent Application No. PCT/US2016/047004 dated Nov. 10, 2016.
(Continued)

*Primary Examiner* — S. V. Clark
(74) *Attorney, Agent, or Firm* — Steven C. Bauman

(57) ABSTRACT

This invention relates to thermosetting resin compositions useful for fluxing underfill applications, particularly in the form of a preapplied film.

18 Claims, 4 Drawing Sheets

Related U.S. Application Data

(60) Provisional application No. 62/206,939, filed on Aug. 19, 2015.

(51) Int. Cl.
*C08K 3/013* (2018.01)
*C08G 59/20* (2006.01)
*C08G 59/24* (2006.01)
*C08G 59/42* (2006.01)
*C08G 59/40* (2006.01)

(56) References Cited

U.S. PATENT DOCUMENTS

| | | | | |
|---|---|---|---|---|
| 6,653,371 | B1 * | 11/2003 | Burns | C08G 59/18 523/455 |
| 6,872,762 | B2 * | 3/2005 | Burns | C08G 59/186 523/455 |
| 7,213,739 | B2 | 5/2007 | Wilson et al. | |
| 7,247,683 | B2 | 7/2007 | Hurley et al. | |
| 9,546,562 | B2 | 1/2017 | Hillier | |
| 2006/0217499 | A1 | 9/2006 | Takenaka | |
| 2013/0344627 | A1 | 12/2013 | Kim et al. | |

FOREIGN PATENT DOCUMENTS

| | | |
|---|---|---|
| JP | 2011140617 | 7/2011 |
| WO | 85/02184 | 5/1985 |
| WO | 2014/070694 | 5/2014 |

OTHER PUBLICATIONS

H. Lu et al. "No-flow Underfill Flip Chip Assembly—An Experimental and Modeling Analysis", Microelec. Reliab., 42, 1205-12 (2001).

* cited by examiner

FLUXING UNDERFILL COMPOSITIONS

BACKGROUND

Field

This invention relates to thermosetting resin compositions useful for fluxing underfill applications, particularly in the form of a preapplied film.

Brief Description of Related Technology

Through silicon via ("TSV") interconnection technology is gaining popularity due to its ability to increase computing capacity with lower power consumption using about the same real estate on a circuit board as traditional semiconductor packages. With TSV, interconnection is made between layered semiconductor die through the die itself rather than by a wire bonding technique around the periphery of the die as seen in die attach applications or through solder interconnection as is seen with capillary flow underfill applications.

In stacked die applications, the gap between die is quite narrow rendering application of capillary flow underfill difficult. While noflow underfill compositions are an option for flip chip assembly, there are recognized technical issues with this approach that has hindered its adoption commercially. See H. Lu et al. "No-flow Underfill Flip Chip Assembly—An Experimental And Modeling Analysis", *Microelec. Reliab.*, 42, 1205-12 (2001).

U.S. Pat. No. 7,213,739 (Wilson) describes and claims a fluxing curative for curing an underfill that comprises an epoxy resin and for fluxing a solder during a solder assembly of an electronic component to an electronic device substrate, the fluxing curative comprising a salt that is a reaction product of an imidazole component and a carboxylic acid component having at least 10 carbon atoms per molecule, where the carboxylic acid component is isostearic acid, 5-n-hexyl-2-(carboxyl-n-heptyl) cyclohex-3-ene carboxylic acid, or a combination thereof. The underfill is reported in the '739 patent to be a solution for application between an electronic component and an electronic device substrate to assist in solder assembly of the electronic component to the electronic device substrate and to provide mechanical shock resistance and thermal cycling resistance.

While the '739 patent describes an underfill based on a fluxing curative comprised of a salt that is a reaction product of an imidazole component and a carboxylic acid component having at least 10 carbon atoms per molecule, that approach has not been found to satisfy the demands of current commercial semiconductor packaging operations.

It would be desirable therefore to provide electronic packaging materials suitable for advanced applications, such as thermosetting resin compositions useful in stacked die applications, particularly those that use TSV interconnection technology.

SUMMARY

The present invention satisfies that desire.

Instead of using a fluxing curative comprised of a salt that is a reaction product of an imidazole component and a carboxylic acid component having at least 10 carbon atoms per molecule as the '791 patent does, the present invention uses a solid phenolic acid, the melting point of which is in the range of 130° C. to 245° C., as the latent flux.

More specifically, the present invention provides thermosetting resin compositions whose components include an epoxy resin component, a hardener, an inorganic filler, and a solid phenolic acid, the melting point of which is in the range of 130° C. to 245° C.

As a solid phenolic acid, many examples may be used.

For instance, the solid organic acid may have a melting point in the range of 140° C. to 230° C., such as in the range of 165° C. to 175° C.

The solid organic acid may have at least one carboxyl group, and in some instances at least one carboxyl group and at least one phenolic hydroxyl group.

The solid organic acid may be embraced by the following structure:

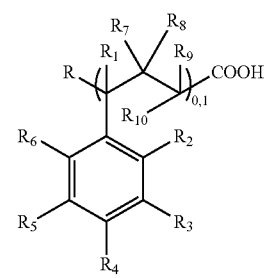

where R is hydrogen or $C_{1-4}$ alkyl; $R_1$ is hydrogen, aryl or phenolic; $R_2$ is hydrogen, hydroxyl, $C_{1-4}$ alkyl or O—Ra, where Ra is C(=O)—Rb where Rb is C1-4 alkyl; $R_3$, $R_4$ and $R_5$ are each independently selected from hydrogen, $C_{1-4}$ alkyl or O—Rb, where Rb is $C_{1-4}$ alkyl; $R_6$ is hydrogen, hydroxyl, or O—Rb, where Rb is $C_{1-4}$ alkyl; and $R_7$-$R_9$ are each independently selected from hydrogen, or $C_{1-4}$ alkyl.

Within this structure, specific examples of the solid organic acid include one or more of 2,3-dihydroxy benzoic acid (melting point of 204° C.–206° C.), syringic acid (melting point of 205° C.–209° C.), 3,4,5-trimethoxy benzoic acid (melting point of 168° C.–171° C.), orselliaic acid (melting point of 175° C.), diphenolic acid (melting point of 167° C.–170° C.) and acetylsalicylic acid (melting point of 140° C.)

In another aspect, the present invention provides a method of making a semiconductor device. The steps of this method include:

providing a silicon wafer;

providing an underfill composition as so defined onto a surface of the silicon wafer to form a layer thereof;

placing solder balls at predetermined positions on the underfill layer;

providing a substrate having electrical contact pads on a surface thereof;

mating the silicon wafer with the substrate such the solder balls are aligned with the electrical contact pads to form a pre-assembly; and exposing the pre-assembly to elevated temperature conditions sufficient to provide fluxing following by curing of the underfill composition to form an assembly; and singulating the assembly to form a plurality of semiconductor devices.

In one embodiment, the substrate is a carrier substrate.

In another embodiment, the substrate is a circuit board.

In still another aspect, a semiconductor device is also provided and comprises:

At least one semiconductor chip having solder balls attached thereto;

At least one carrier substrate or a circuit board having electrical contact pads on a surface thereof to which the at least one semiconductor chip is electrically interconnected through the solder balls; and An underfill composition between the semiconductor chip and the carrier substrate or circuit board.

In these embodiments, the underfill composition as noted above includes an epoxy resin component, a hardener, an inorganic filler, and a solid phenolic acid, the melting point of which is in the range of 130° C. to 245° C.

Among other things, the solid organic acid acts as a fluxing agent, which when exposed to temperature conditions within its melting point range and when exposed to electrical interconnections and solder, removes oxidation formed at the solder surface to form quality electrical interconnections.

In these embodiments, the electrical interconnection may be made by TSV interconnection technology, where the connection is made directly through the wafer and/or substrate rather than about the periphery of the semiconductor device such as with wire bonding.

Figure 1:
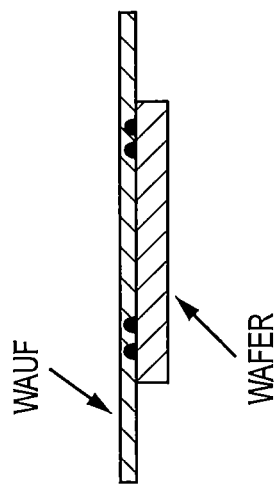
FIG. 1 depicts a schematic of an underfill composition disposed as a layer on wafer into which have been placed solder balls in predetermined positions. The solder ball-attached wafer is inverted and aligned in a mating fashion with a substrate having solder pads.

In some of the figures, the terms WAUF (wafer applied underfill film) and PAUF (preapplied underfill film) are used. They are intended herein to mean the same thing and should be considered interchangeable.

DETAILED DESCRIPTION

The thermosetting resin compositions of the present invention, as noted above, include among other constituents an epoxy resin component, a hardener, an inorganic filler, and a solid phenolic acid, the melting point of which is in the range of 130° C. to 245° C.

More specifically, the solid organic acid has a melting point in the range of 140° C. to 230° C., such as in the range of 165° C. to 175° C.

The solid organic acid may have at least one carboxyl group, and at least one carboxyl group and at least one phenolic hydroxyl group.

The solid organic acid may be embraced by the following structure:

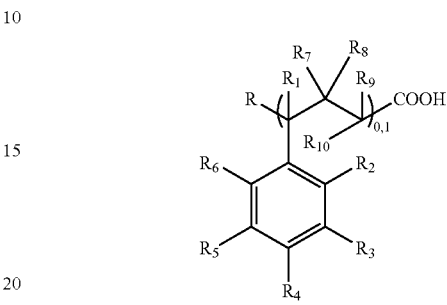

where R is hydrogen or $C_{1-4}$ alkyl; $R_1$ is hydrogen, aryl or phenolic; $R_2$ is hydrogen, hydroxyl, $C_{1-4}$ alkyl or O—Ra, where Ra is C(=O)—Rb where Rb is C1-4 alkyl; $R_3$, $R_4$ and $R_5$ are each independently selected from hydrogen, $C_{1-4}$ alkyl or O—Rb, where Rb is $C_{1-4}$ alkyl; $R_6$ is hydrogen, hydroxyl, or O—Rb, where Rb is $C_{1-4}$ alkyl; and $R_7$-$R_9$ are each independently selected from hydrogen, or $C_{1-4}$ alkyl.

Within this structure, specific examples of the solid organic acid include one or more of 2,3-dihydroxy benzoic acid (melting point of 204° C.–206° C.), syringic acid (melting point of 205° C.–209° C.), 3,4,5-trimethoxy benzoic acid (melting point of 168° C.–171° C.), orselliaic acid (melting point of 175° C.), diphenolic acid (melting point of 167° C.–170° C.) and acetylsalicylic acid (melting point of 140° C.)

The solid organic acid may be used in the inventive composition in an amount from about 0.5 to about 15 percent by weight, such as about 2 to about 10 percent by weight.

The solid organic acid imparts latency to the inventive composition. In the past, the solid nature of certain additives to epoxy based compositions have operated in such a manner. See e.g. U.S. Pat. No. 6,872,762 (Burns)(conferring improvements in yield point).

Advantageously, the inventive composition should not cure until after the solid organic acid acts as a flux for the solder balls with which the inventive composition comes into contact after application, which will have collapsed and the solder interconnections formed during a solder reflow operation. Put another way, cure of the inventive composition is controlled such that the collapse of the solder balls occurs first.

In this way, the inventive composition may be pre-applied to a wafer, a semiconductor chip or package, or a circuit board and used in the assembly of a semiconductor device. As so pre-applied, the inventive composition is considered to be latent until a certain environment is introduced. Thus, the inventive composition allows for application onto an integrated circuit device or substrate such as in film form prior to solder reflow instead of, or after a reflow operation, by capillary action. Additionally, the latent nature allows for the inventive composition to be stored for extended periods of time without demonstrating any deterioration of performance or prior to solder reflow.

For example, when maintained at conventional storage temperatures of between about 20 and about 30° C., the inventive composition undergoes less than about a 20% increase in viscosity over a period of 24 hours immediately following its formation. As such, the inventive composition is considered to have a pot life of at least about 24 hours. The latent nature and viscosity of the inventive composition allows the inventive composition to flow prior to, and after, attaining the maximum temperature during a solder reflow operation, which minimizes the occurrence of voids and maximizes the bonding between the underfill, the device, and the substrate. Typically, the inventive composition has a viscosity within the range of about 1 centipoise to about 20,000 centipoise at a temperature between about 50° C. and a maximum reflow temperature (e.g., about 170° C.).

Gel point measurements are useful in determining the degree of latency. In general, at cure initiation the viscous modulus (loss modulus) is greater than the elastic modulus (storage modulus). As cure proceeds both the elastic and viscous moduli increase, but they increase at different rates. Eventually, the elastic modulus equals and then exceeds the viscous modulus. The gel point is the point during cure when the elastic modulus equals the viscous modulus. Prior to reaching the gel point, the epoxy resin component generally behaves like a liquid; after reaching the gel point, the epoxy resin component generally behaves like a solid. Because the gel point depends upon the kinetics of the reaction between the epoxy resin component and the fluxing curative, it is temperature dependent. That is the specific temperature and the rate at which that specific temperature is reached will influence the gel point. Thus, ordinarily, as the rate at which an inventive composition is heated increases, the temperature at which the gel point occurs also increases.

Thus, the constituents of the inventive composition are chosen such that the gel point is reached substantially contemporaneous with or following the liquidus temperature of the solder. In this way, the solder balls can collapse, the fluxing activity of the solid organic acid has been liberated, and an electrical interconnection established between the semiconductor device and the carrier substrate or circuit board.

Once exposed to an elevated temperature environment, such as during a solder reflow operation, the solid organic acid begins to melt and performs its fluxing activity (i.e., removing oxides and other impurities, and preventing or at least minimizing the ability for the further formation of oxides) from the solder and the surfaces of the metal pads and then catalyzes, initiates, participates in and/or causes the cure of the epoxy resin component.

Examples of the epoxy resin component are given below. For instance the epoxy resin component may include the combination of two or more different bisphenol based epoxies. These bisphenol based epoxies may be selected from bisphenol A, bisphenol F, or bisphenol S epoxies, or combinations thereof. In addition, two or more different bisphenol epoxies within the same type of resin (such A, F or S) may be used.

Commercially available examples of the bisphenol epoxies desirable for use herein include bisphenol-F-type epoxies (such as RE-404-S from Nippon Kayaku, Japan, and EPICLON 830 (RE1801), 830S (RE1815), 830A (RE1826) and 830 W from Dai Nippon Ink & Chemicals, Inc., and RSL 1738 and YL-983U from Resolution) and bisphenol-A-type epoxies (such as YL-979 and 980 from Resolution).

The bisphenol epoxies available commercially from Dai Nippon and noted above are promoted as liquid undiluted epichlorohydrin-bisphenol F epoxies having much lower viscosities than conventional epoxies based on bisphenol A epoxies and have physical properties similar to liquid bisphenol A epoxies. Bisphenol F epoxy has lower viscosity than bisphenol A epoxies, all else being the same between the two types of epoxies, which affords a lower viscosity and thus a fast flow underfill sealant material. The EEW of these four bisphenol F epoxies is between 165 and 180. The viscosity at 25° C. is between 3,000 and 4,500 cps (except for RE1801 whose upper viscosity limit is 4,000 cps). The hydrolyzable chloride content is reported as 200 ppm for RE1815 and 830 W, and that for RE1826 as 100 ppm.

The bisphenol epoxies available commercially from Resolution and noted above are promoted as low chloride containing liquid epoxies. The bisphenol A epoxies have an EEW (g/eq) of between 180 and 195 and a viscosity at 25° C. of between 100 and 250 cps. The total chloride content for YL-979 is reported as between 500 and 700 ppm, and that for YL-980 as between 100 and 300 ppm. The bisphenol F epoxies have an EEW (g/eq) of between 165 and 180 and a viscosity at 25° C. of between 30 and 60. The total chloride content for RSL-1738 is reported as between 500 and 700 ppm, and that for YL-983U as between 150 and 350 ppm.

In addition to the bisphenol epoxies, other epoxy compounds are included within the epoxy component of the present invention. For instance, cycloaliphatic epoxies, such as 3,4-epoxycyclohexylmethyl-3,4-epoxycyclohexylcarbonate, are used. Also monofunctional, difunctional or multifunctional reactive diluents to adjust the viscosity and/or lower the Tg are also used, such as butyl glycidyl ether, cresyl glycidyl ether, polyethylene glycol glycidyl ether or polypropylene glycol glycidyl ether.

Among the epoxies suitable for use herein also include polyglycidyl derivatives of phenolic compounds, such as those available commercially under the tradename EPON, such as EPON 828, EPON 1001, EPON 1009, and EPON 1031 from Resolution; DER 331, DER 332, DER 334, and DER 542 from Dow Chemical Co.; and BREN-S from Nippon Kayaku. Other suitable epoxies include polyepoxides prepared from polyols and the like and polyglycidyl derivatives of phenol-formaldehyde novolacs, the latter of such as DEN 431, DEN 438, and DEN 439 from Dow Chemical. Cresol analogs are also available commercially under the tradename ARALDITE, such as ARALDITE ECN 1235, ARALDITE ECN 1273, and ARALDITE ECN 1299 from Ciba Specialty Chemicals Corporation. SU-8 is a bisphenol-A-type epoxy novolac available from Resolution. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba Specialty Chemicals and PGA-X and PGA-C from the Sherwin-Williams Co.

Appropriate monofunctional epoxy coreactant diluents for use herein include those that have a viscosity which is lower than that of the epoxy component, ordinarily, less than about 250 cps.

The monofunctional epoxy coreactant diluents should have an epoxy group with an alkyl group of about 6 to about 28 carbon atoms, examples of which include $C_{6-28}$ alkyl glycidyl ethers, $C_{6-28}$ fatty acid glycidyl esters and $C_{6-28}$ alkylphenol glycidyl ethers.

In the event such a monofunctional epoxy coreactant diluents is included, the coreactant diluent should be employed in an amount of up to about 5 percent by weight to about 15 percent by weight, such as about 8 percent by weight to about 12 percent by weight, based on the total weight of the composition.

The epoxy component should be present in the composition in an amount which the range of about 10 percent by weight to about 95 percent by weight, desirably about 20 percent by weight to about 80 percent by weight, such as about 60 percent by weight.

As a hardener, a cyanate ester or an aromatic amine may be used. Examples of the cyanate ester include aryl compounds having at least one cyanate ester group on each molecule and may be generally represented by the formula $Ar(OCN)_m$, where m is an integer from 2 to 5 and Ar is an aromatic radical. The aromatic radical Ar should contain at least 6 carbon atoms, and may be derived, for example, from aromatic hydrocarbons, such as benzene, biphenyl, naphthalene, anthracene, pyrene or the like. The aromatic radical Ar may also be derived from a polynuclear aromatic hydrocarbon in which at least two aromatic rings are attached to each other through a bridging group. Also included are aromatic radicals derived from novolac-type phenolic resins—i.e., cyanate esters of these phenolic resins. The aromatic radical Ar may also contain further ring-attached, non-reactive substituents.

Examples of such cyanate esters include, for instance, 1,3-dicyanatobenzene; 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane and 3,3',5,5'-tetramethyl bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl) phosphate; bis(3-chloro-4-cyanatophenyl)methane; cyanated novolac; 1,3-bis[4-cyanatophenyl-1-(methylethylidene)]benzene and cyanated bisphenol-terminated polycarbonate or other thermoplastic oligomer.

Other cyanate esters include cyanates disclosed in U.S. Pat. Nos. 4,477,629 and 4,528,366, the disclosure of each of which is hereby expressly incorporated herein by reference; the cyanate esters disclosed in U.K. Pat. No. 1,305,702, and the cyanate esters disclosed in International Patent Publication WO 85/02184, the disclosure of each of which is hereby expressly incorporated herein by reference. Of course, combinations of these cyanate esters within the imidazole component of the compositions of the present invention are also desirably employed herein.

A particularly desirable cyanate ester for use herein is available commercially from Ciba Specialty Chemicals, Tarrytown, N.Y. under the tradename AROCY 366 (1,3-bis [4-cyanatophenyl-1-(methylethylidene)]benzene). The structures of four other desirable "AROCY" cyanate esters are

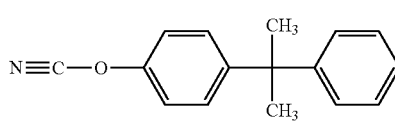

"AROCY" B-10

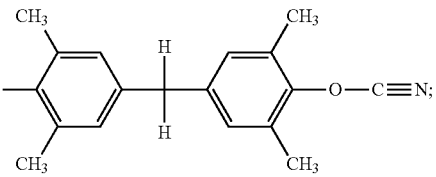

"AROCY" M-30

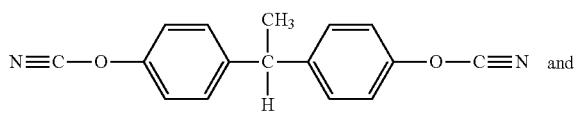 and

"AROCY" L-10

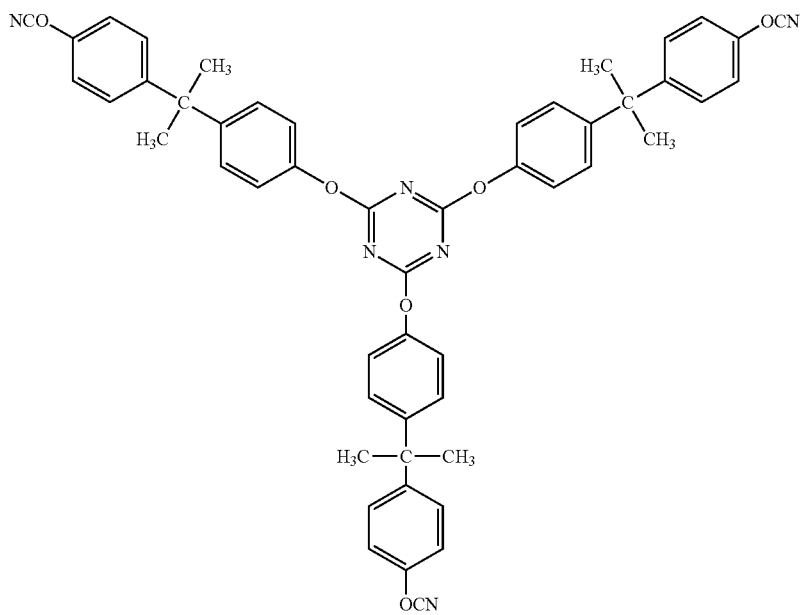

"AROCY" B-30

Examples of the aromatic amine include 3-aminophenylsulfone, 4-amino phenyl sulfone, and 4,4-methylenebis(o-ethylaniline), the latter of which is known commercially as Acetocure MBOEA.

The hardener should be present in an amount of 10 to 50 percent by weight of the composition.

As an inorganic filler, many materials are potentially useful. For instance, inorganic fillers may be useful, particularly where coefficients of thermal expansion ("CTE") between the semiconductor chip and the substrate to be mated and sealed are to be more closely matched. The inorganic filler influences the CTE and thus can be used to reduce thermal expansion of the cured material, thereby reducing warpage. The inorganic filler component may often include reinforcing silicas, such as fused spherical silicas, and may be untreated or treated so as to alter the chemical nature of their surface. The inorganic filler component however should include particles having a mean particle size distribution in the 0.1 to 50 micron range. A commercially available example of such particles is sold by Tatsumori or Denka in Japan. In addition, nano-size silica powder might be added, such as those sold under the tradename NANOPDX by Nanoresins, Germany. NANOPDX fillers are monodisperse silica filler dispersions in epoxy resins, at a level of up to about 50 percent by weight, available from Nanoresins, Germany. NANOPDX fillers ordinarily are believed to have a particle size of about 5 nm to about 80 nm.

Nanoresins also produces materials under the NANOPDX E trade designations. For instance, Nanoresins reports NANOPDX E-brand products enable the complete impregnation of electronic components which are difficult to seal otherwise and provide a large spectrum of mechanical and thermal properties such as reduced shrinkage and thermal expansion, fracture toughness and modulus. In Table 1 below, Nanoresin provides information on the four noted NANOPDX E products:

TABLE 1

| Type | $SiO_2$-Content [wtpercent] | Base resin | EEW [g/equiv.] | Dyn. viscosity, 25° C. [mPa · s] | Characterization |
|---|---|---|---|---|---|
| NANOPOX E 430 | 40 | DGEBA/DGEBF | 290 | 45,000 | no crystallization |
| NANOPOX E 470 | 40 | DGEBA | 295 | 60,000 | basic type |
| NANOPOX E 500 | 40 | DGEBF | 275 | 20,000 | low viscous |
| NANOPOX E 600 | 40 | EEC[1] | 220 | 4,000 | cycloaliphatic formulations |

1 3,4-epoxycyclohexylmethyl-3,4-epoxycyclohexyl-carbonate

Nanoresins reports that important properties can be significantly improved in epoxy formulations by using NANOPDX E-brand products. For instance:
  lower viscosity of the formulation in comparison to conventional reinforced fillers
  no sedimentation
  increase in the fracture toughness, impact resistance and modulus
  improved scratch and abrasion resistance
  reduction of shrinkage and thermal expansion
  improvement, or at least no negative effect, in numerous desired properties, such as thermal stability, chemical resistance, glass transition temperature, weathering resistance, and dielectric properties.

NANOPDX E is used in applications where these improvements to properties are desired or necessary, without compromising the processability by an excessive increase in viscosity (known from fumed silica). Application examples are encapsulation materials and coatings. It is important to emphasize the excellent impregnation properties of NANOPDX E due to the small particle size and the absence of agglomerates. This also enables the complete impregnation of electronic components which are difficult to seal otherwise.

According to the manufacturer, NANOPDX E-brand products are a colloidal silica sol in an epoxy resin matrix. The disperse phase consists according to the manufacturer of surface-modified, spherically shaped $SiO_2$ nanoparticles with diameters below 50 nm and an extremely narrow particle size distribution. These spheres, only a few nanometers in size, are distributed agglomerate-free in the resin matrix. This according to the manufacturer produces a very low viscosity of the dispersion with $SiO_2$ content of up to 40 percent by weight. As reported by the manufacturer, the nanoparticles are chemically synthesized from aqueous sodium silicate solution. In this process the binding agent is not damaged, in contrast to processes in which powdered fillers are dispersed with dissolvers or other equipment using high shear energy.

Other desirable materials for use as a filler component include those constructed of or containing aluminum oxide, silicon nitride, aluminum nitride, silica-coated aluminum nitride, boron nitride and combinations thereof.

The filler component, when used, should be used in an amount of about 10 to about 80 percent by weight of the composition, such as about 12 to about 60 percent by weight, desirably within the range of about 15 to about 35 percent by weight.

The inventive underfill composition can be used in dispensible or flowable form or in the form of a film. When used in the form of a film, the composition may be diluted in solvent and then cast onto a carrier substrate for subsequent use or directly onto a circuit board or semiconductor die. Of course, the solvent will be flashed off or evaporated to leave a B-staged film. Alternatively, the inventive composition can be laminated to a support tape, after which the composition will be B-staged. B-staging refers to heating the composition to an extent sufficient to flash or evaporate the solvent but below a temperature that causes the respective constituents of the composition to react. In this case, the composition is rendered dry (i.e., non-tacky) by solvent removal. In other cases, B-staging is accomplished by a partial curing of or setting up the composition so that it reaches a non-tacky state.

To prepare the inventive composition in film form the film thickness needs to be considered. When the thickness of the film is too great, it may be difficult to downsize an electronic device, as the device may have excess underfill film reaching beyond the bondlines. When the film thickness is too small, the development of adequate bond strength may be challenged and the stress impacts intended to be absorbed by the underfill not be realized as the composition has not filled the space between the semiconductor die and the circuit board sufficiently. Thus, the film thickness should be between about 5 μm and about 100 μm.

The thickness of the underfill after application onto the substrate should be considered in relation to the diameter of the solder ball. For instance, in some embodiments, it may be desirable for the film thickness to be between about 50 and about 95 percent of the height of the solder ball when placed thereon, whereas in other embodiments it may be desirable for the film thickness to be between about 70 and about 170 percent of the height of the solder ball.

As noted, the underfill composition may be in film form, and in so forming the film the underfill composition is dissolved or dispersed in a solvent, and thereafter applied on a supporting substrate; and the underfill composition is then B-staged by removing the solvent.

The supporting substrate may be a silicon wafer. The supporting structure may also be a release liner made from a plastic film, such as a polyethylene terephthalate film, a polytetrafluoroethylene film, a polyethylene film, a polypropylene film and a polymethylpentene film. The supporting structure may also be a carrier substrate.

The solvent used to dilute the inventive composition for application onto the supporting substrate should have a boiling point that is low enough to allow for its facile removal and high enough so that it is only flashed or evaporated when it is desirable to do so. Specific solvents having a relatively low boiling point include methanol, ethanol, 2-methoxyethanol, 2-ethoxyethanol, 2-butoxyethanol, methyl ethyl ketone, acetone, methyl isobutyl ketone, toluene and xylene. Composition coating efficiency may be improved when a solvent having relatively high boiling point is used, examples of which include dimethylacetamide, dimethylformamide, N-methylpyrrolidone and cyclohexanone. These solvents may be used individually or in combination.

Conventional processes, such as a knife coating process, a roll coating process, a spray coating process, a gravure coating process, a bar coating process, a curtain coating process, stencil coating process and the like, may be used to apply the underfill composition to the substrate.

B-staging conditions may be adjusted according to the specific constituents used to make the composition and the thickness of the film to be produced, solvent and the like. For instance, the temperature to which the composition is exposed to drive off the solvent should be between 70° C. to 150° C., such as from 90° C. to 130° C., and for a time period of 0.5 minutes to 10 minutes. B-staging may be carried out by keeping the composition in a static drying oven for a certain time, or by placing it in an in-line oven, a conveyor-type furnace, or the like.

In film form, the inventive composition is useful as a fluxing underfill composition, which has been formed on or can be preapplied onto one or more of a semiconductor chip, a carrier substrate or a circuit board, is capable of filling the underfill space of narrow tolerances, and is capable of achieving a controlled fillet height to enable more precise die stacking.

The particular alloy chosen for the solder ball should be compatible with the metal(s) used to form the leads of the substrate (i.e., upon removal of oxides from the metal(s) by the fluxing agent, the solder wets the leads during reflow to form an electrical interconnection). The choice of alloy for the solder ball may depend upon environmental and/or worker safety concerns (e.g., leading to the use of a lead free solders) or the processing temperature conditions (e.g., to ensure that there is no degradation of the semiconductor package or circuit board during reflow).

The solder ball should melt and thus collapse at a temperature at which the underfill does not degrade. For example, it is typically desirable for a solder to melt at a temperature that is less than about 300° C., such as between about 180° C. and about 260° C., desirably between about 220° C. and about 260° C. The alloy chosen for the solder ball should be stable (e.g., it does not evaporate) at a temperature that is between about 10° C. and about 40° C. above the melt temperature because typical reflow operations result in the solder attaining such temperatures. For example, when reflowing a solder having a relatively high melting temperature such as between about 210° C. and about 240° C., the reflow temperature is typically between about 220° C. and about 280° C. Similarly, when reflowing a solder having a relatively low melting temperature such as between about 160° C. and about 190° C., the reflow temperature is lower, typically between about 170° C. and about 230° C.

The inventive composition may be used with any lead-containing solders (e.g., Sn63Pb37 and Sn62Pb36Ag2) or solders that are substantially free of lead. Such Pb-free solders tend to have higher liquidus temperatures and/or require longer reflow durations than lead-containing solders. Examples of Pb-free solders include Au80Sn20, Sn96.2Ag2.5Cu0.8Sb0.5, Sn65Ag25Sb10, Sn96.5Ag3.5, Sn95.5Ag3.8Cu0.7, Sn96.5Ag3Cu0.5, Sn95.5Ag4Cu0.5, Sn93.6Ag4.7Cu1.7, Sn42Bi58, Sn90Bi9.5Cu0.5, Sn99.3Cu0.7, Sn99Cu1, Sn97Cu3, Sn87.1In10.5Ag2Sb0.4, Sn77.2In20Ag2.8, Sn63.61n8.8Zn27.6, Sn97Sb3 and Sn95Sb5.

Figure 2:
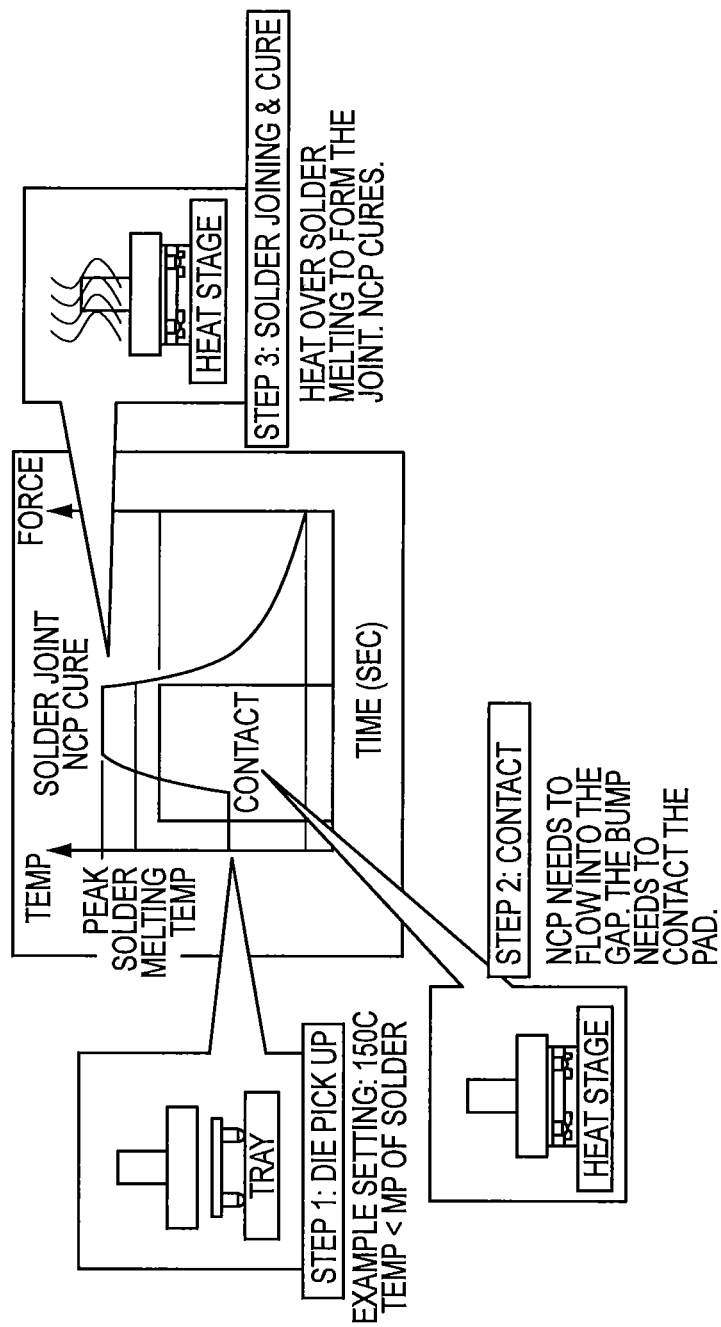
FIG. 2 depicts a schematic plot of temperature and force over time to illustrate the performance property development of the wafer applied underfill after it is applied to the semiconductor die and subjected to increasing temperature and force.
Figure 3:
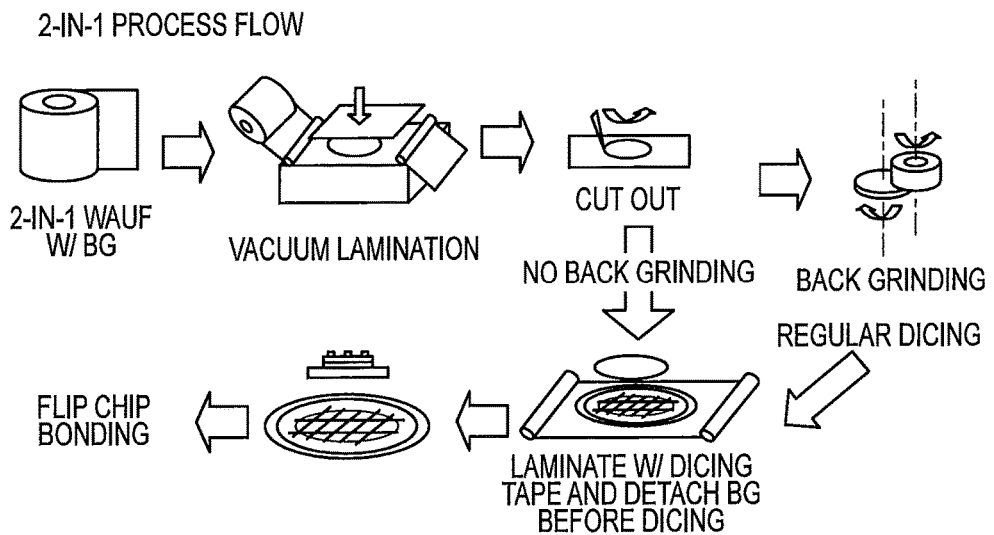
FIG. 3 depicts a process to use the inventive composition in a film form in a flip chip assembly.

The underfill may cover at least a portion of the contact pads and/or solder balls on the substrate and/or wafer to confer a level of protection against oxidation, contamination, and mechanical damage to the metal. The substrate and the wafer may be brought together and the contact pads and solder balls aligned using a pick and place machine. See e.g. FIG. 2. In so doing, the underfill composition ordinarily is displaced and compressed substantially evenly over the portion of the substrate surface that the wafer overlies. The substrate and the wafer, after being positioned on the substrate, are then typically run through a multi-zone oven with individual heat controls that permit a heating profile appropriate for the specific solder. During reflow, the solid organic acid melts and provides fluxing activity to the metal surfaces, thereby reducing oxides present in or on the solder balls or on the surfaces of the contact metal pads. The solder can then form the electrical interconnections between the substrate and wafer. The underfill flows and as the temperature is increased to the solder liquidus and higher, the underfill cures. Upon cooling to room temperature at the end of the reflow cycle, the solder solidifies thereby forming a mechanical and electrical interconnection and the cured underfill provides stability to the structure.

Alternatively, a flip chip bonder can be used to apply heat and pressure instead of the heat of the reflow oven. The use of a flip chip bonder allows a flip chip to be assembled to a circuit board that already has components mounted thereto.

EXAMPLES

Sample Nos. 1 and 2 are set forth below in Table 1. Sample No. 1 is provided for comparative purpose; Sample No. 2 is within the scope of the invention.

TABLE 1

| Constituents | | Sample No./Amt (wt %) | |
|---|---|---|---|
| Type | Identity | 1 | 2 |
| Epoxy | TACTIX 742[#] | 14.6 | 13.6 |
| | EPICLON 830-S[$] | 8.6 | 8.1 |
| | EPICLON N665-EXP[%] | 29.2 | 27.3 |
| Hardener | CUREZOL 2P4MHZ-PW[@] | 2.6 | 2.4 |
| Solid Organic Acid | Diphenolic acid | — | 4.0 |
| Inorganic Filler | YA050C-MJE[1] | 40 | 40 |
| Toughener | M52N | 2.5 | 2.3 |
| | Micro BGA 24-440B | 2.5 | 2.3 | i. [#]Solid tri-glycidyl epoxy, EEW 150-170, softening point = 90-100° C.
ii. [$]Bisphenol F epoxy, EEW165-180, low viscosity liquid
iii. [%]Solid cresol Novolac epoxy, EEW 200-215, softening point = 64-72° C.
iv. [1]Nanosilica with methacryl silane surface treatment
v. [@]Imidazole The compositions were each prepared by mixing together the epoxy constituents with a mechanical mixer until dissolution to a homogeneous solution was observed. The toughener and inorganic filler were then added with continued mixing for a period of time of about 30-60 minutes at room temperature until a viscous paste with a substantially uniform consistency was achieved. The solid organic acid was added last. The so formed compositions were then transferred into containers until ready for use.

These compositions were then converted to a B-staged underfill composition in film form by diluting the composition with methyl ethyl ketone as a solvent in a ratio of about 1 to 1. The diluted composition was then dispensed as a thin (about 5 to 100 um, such as about 15 to 50 um) film onto a release liner, and then exposing the thin film to elevated temperature conditions of about 80 to 110° C. for a period of time of about 1 to about 5 minutes to drive off the solvent.

Figure 5:
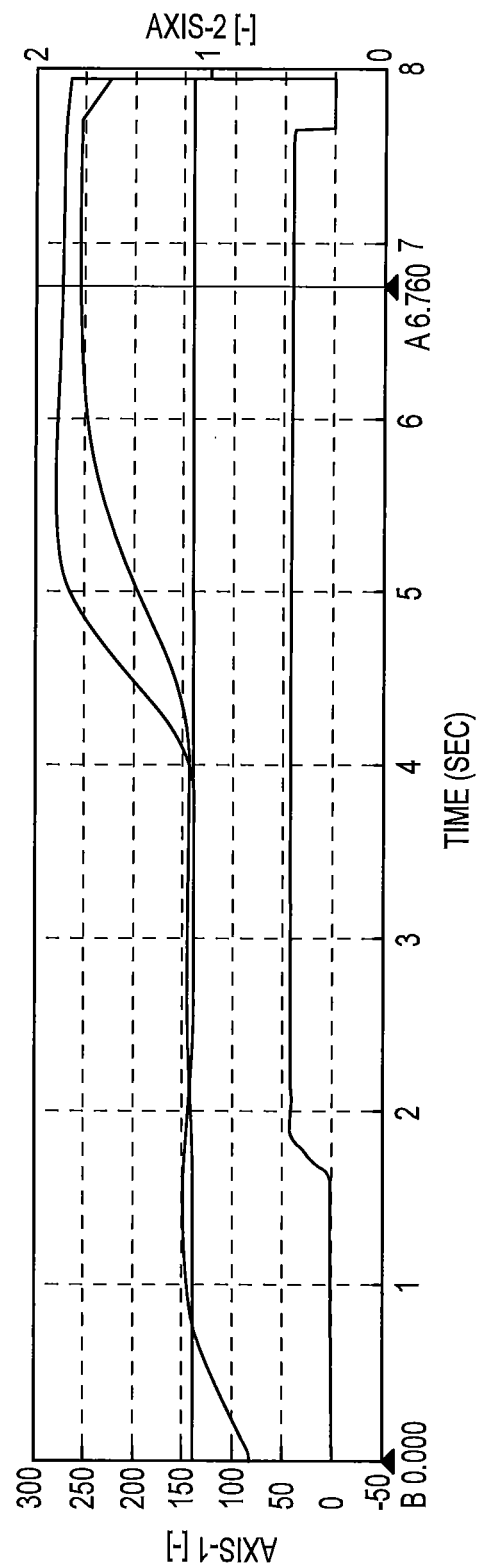
FIG. 5 depicts a schematic diagram of thermal compression molding conditions, where pressure versus time is illustrated with increasing temperature. When using a Toray FC3000F thermal compression bonding machine, a representative profile is: Pick Up Temperature (60° C.); Stage Temperature (140° C.); Standby Temperature (60° C.); Ground Temperature (140° C.); Step 1: Head Pressure (40 N); (de)Pressurization (0.2 s); Head Keeping Period (1.8 s); Head Temperature (140° C.); and Time (2 s); Step 2: Head Pressure (40 N); (de)Pressurization (0.2 s); Head Keeping Period (3.8 s); Head Temperature (260° C.); and Time (4 s). When the Head Pressure is reached, compression force is placed on the wafer; the upper curve appearing after 4 seconds is the temperature that the head is set to on the machine, whereas the curve just below the upper curve appearing after 4 seconds is the temperature that is measured at the head.

In practice, the B-staged underfill composition in film form are used by exposure to thermal compression molding conditions, such as those depicted in FIG. 5.

Figure 4:
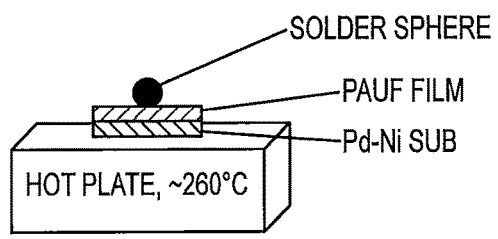
FIG. 4 depicts a schematic diagram of a solder ball placed on a preapplied underfill film and subjected to elevated temperature conditions to measure contact angle values.

To evaluate the performance of the so-formed B-staged fluxing underfill composition, solder ball wettability on a substrate was used as a measure to assess the effectiveness of fluxing. Here, with reference to FIG. 4, a pre-applied underfill film was laminated onto a Pd-coated Ni substrate. One film was in accordance with the present invention and one made without the solid organic acid was chosen as a control for comparative purposes. One single 500 um diameter eutectic SAC (Sn96.5Ag3.0Cu0.5) solder sphere was placed on top of the film. The sphere was pressed into the film to ensure that contact was made with the Ni substrate. The so formed assembly was then placed on a hot plate, the temperature of which was set to 260° C. After a period of time of 10 seconds at that temperature, the sphere was examined for wetting behavior on the substrate surface, which is quantified by contact angle measurements. The control demonstrated a contact angle of 150° C., while the inventive pre-applied underfill film demonstrated a contact angle of 45° C. The contact angle measurements demonstrate that better solder wettability on the substrate is achieved using the inventive underfill composition because large contact angles (such as greater than about 90° C.) show poor wettability for the composition, which causes poor joint formation and interconnect quality.

What is claimed is:

1. A thermosetting resin composition, comprising:

An epoxy component;

A hardener;

A filler component; and

A solid organic acid, having a melting point in the range of 130° C. to 245° C., wherein the solid organic acid is embraced by the following structure:

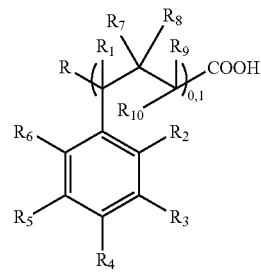

wherein R is hydrogen or $C_{1-4}$ alkyl; $R_1$ is hydrogen, aryl or phenolic; $R_2$ is hydrogen, hydroxyl, $C_{1-4}$ alkyl or O—Ra, wherein Ra is C(=O)—Rb wherein Rb is $C_{1-4}$ alkyl; $R_3$, $R_4$ and $R_5$ are each independently selected from hydrogen, $C_{1-4}$ alkyl or O—Rb, wherein Rb is $C_{1-4}$ alkyl; $R_6$ is hydrogen, hydroxyl, or O—Rb, wherein Rb is $C_{1-4}$ alkyl; and $R_7$-$R_9$ are each independently selected from hydrogen, or $C_{1-4}$ alkyl.

2. The composition of claim 1, wherein the solid organic acid has a melting point in the range of 140° C. to 230° C.

3. The composition of claim 1, wherein the solid organic acid has a melting point in the range of 165° C. to 175° C.

4. The composition of claim 1, wherein the solid organic acid is embraced by one or more of 2,3-dihydroxy benzoic acid, syringic acid, 3,4,5-trimethoxy benzoic acid, orselliaic acid, diphenolic acid and acetylsalicylic acid.

5. The composition of claim 1, wherein the composition cures at a temperature above about 130° C.

6. The composition of claim 1, wherein the composition cures at a temperature above about 260° C.

7. The composition of claim 1, in the form of a film.

8. The composition of claim 7, in the form of a film disposed on a release liner.

9. The composition of claim 7, in the form of a film disposed on one or more of a semiconductor chip, a carrier substrate, or a circuit board.

10. The composition of claim 1, cured under thermal compression bonding conditions.

11. An assembly comprising:

A thermosetting resin composition, comprising:

An epoxy component;

A hardener;

A filler component; and

A solid organic acid, having a melting point in the range of 130° C. to 245° C., wherein the solid organic acid is embraced by the following structure:

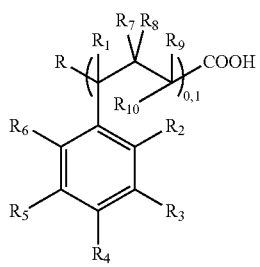

wherein R is hydrogen or $C_{1-4}$ alkyl; $R_1$ is hydrogen, aryl or phenolic; $R_2$ is hydrogen, hydroxyl, $C_{1-4}$ alkyl or O—Ra, wherein Ra is C(=O)—Rb wherein Rb is C1-4 alkyl; $R_3$, $R_4$ and $R_5$ are each independently selected from hydrogen, $C_{1-4}$ alkyl or O—Rb, wherein Rb is $C_{1-4}$ alkyl; $R_6$ is hydrogen, hydroxyl, or O—Rb, wherein Rb is $C_{1-4}$ alkyl; and $R_7$-$R_9$ are each independently selected from hydrogen, or $C_{1-4}$ alkyl, and wherein the composition is in film form and disposed between:
- A silicon wafer having an active side with solder bumps protruding therefrom and
- A semiconductor die with solder balls attached thereto and in alignment with the solder bumps on the silicon wafer.

12. The assembly of claim 11, wherein the solid organic acid acts as a fluxing agent for the solder balls.

13. The assembly of claim 11, wherein the solid organic acid acts as a catalyst for cure of the epoxy component.

14. The assembly of claim 11, wherein the solder balls are constructed from Sn-Pb solder alloys, Pb-free solder alloys, and combinations thereof.

15. The assembly of claim 14, wherein the composition comes into contact with the solder balls at reflow temperatures the composition wets the solder balls to form a contact angle of less than 90°.

16. The assembly of claim 11, wherein the solder ball is constructed from a member selected from the group consisting of Sn63:Pb37, Pb95:Sn5, Sn:Ag3.5:Cu0.5 and Sn:Ag3.3:Cu0.7.

17. A method of making a semiconductor device, steps of which comprise:
providing a silicon wafer;
providing an underfill composition according to claim 1 onto a surface of the silicon wafer to form a layer thereof;
placing solder balls at predetermined positions on the underfill layer;
providing a substrate having electrical contact pads on a surface thereof;
mating the silicon wafer with the substrate such the solder balls are aligned with the electrical contact pads to form a pre-assembly;
exposing the pre-assembly to elevated temperature conditions sufficient to provide fluxing following by curing of the underfill composition to form an assembly; and
singulating the assembly to form a plurality of semiconductor devices.

18. A semiconductor device comprising:
At least one semiconductor chip having solder balls attached thereto;
At least one carrier substrate or a circuit board having electrical contact pads on a surface thereof to which the at least one semiconductor chip is electrically interconnected through the solder balls; and
A composition according to claim 1 disposed between the semiconductor chip and the carrier substrate or circuit board.

* * * * *

UNITED STATES PATENT AND TRADEMARK OFFICE
CERTIFICATE OF CORRECTION

PATENT NO. : 10,283,378 B2
APPLICATION NO. : 15/899878
DATED : May 7, 2019
INVENTOR(S) : Hong Jiang Page 1 of 1

It is certified that error appears in the above-identified patent and that said Letters Patent is hereby corrected as shown below:

In the Specification

Column 9, Line 23-24: Change "NANOPDX" to -- NANOPOX --.

Column 9, Line 24: Change "NANOPDX" to -- NANOPOX --.

Column 9, Line 27: Change "NANOPDX" to -- NANOPOX --.

Column 9, Line 30: Change "NANOPDX" to -- NANOPOX --.

Column 9, Line 32: Change "NANOPDX" to -- NANOPOX --.

Column 9, Line 38: Change "NANOPDX" to -- NANOPOX --.

Column 9, Line 61: Change "NANOPDX" to -- NANOPOX --.

Column 10, Line 7: Change "NANOPDX" to -- NANOPOX --.

Column 10, Line 12-13: Change "NANOPDX" to -- NANOPOX --.

Column 10, Line 17: Change "NANOPDX" to -- NANOPOX --.

In the Claims

Column 15, Line 15: Change "Cl-4" to -- C1-4 --.

Signed and Sealed this
Eighth Day of October, 2019

Andrei Iancu
*Director of the United States Patent and Trademark Office*